United States Patent
Takagi

(10) Patent No.: US 9,335,391 B2
(45) Date of Patent: May 10, 2016

(54) MULTICHANNEL RF SIGNAL SWITCHING DEVICE AND MAGNETIC RESONANCE IMAGING APPARATUS HAVING MULTICHANNEL RF SIGNAL SWITCHING DEVICE

(75) Inventor: Mitsuo Takagi, Otawara (JP)

(73) Assignees: KABUSHIKI KAISHA TOSHIBA, Tokyo (JP); TOSHIBA MEDICAL SYSTEMS CORPORATION, Tochigi-Ken (JP)

(*) Notice: Subject to any disclaimer, the term of this patent is extended or adjusted under 35 U.S.C. 154(b) by 806 days.

(21) Appl. No.: 13/585,055

(22) Filed: Aug. 14, 2012

(65) Prior Publication Data

US 2012/0306498 A1 Dec. 6, 2012

Related U.S. Application Data

(63) Continuation of application No. PCT/JP2011/077696, filed on Nov. 30, 2011.

(30) Foreign Application Priority Data

Nov. 30, 2010 (JP) ................... 2010-267585

(51) Int. Cl.
- *H01P 1/10* (2006.01)
- *G01R 33/34* (2006.01)
- *G01R 33/36* (2006.01)

(52) U.S. Cl.
CPC ................... *G01R 33/3664* (2013.01)

(58) Field of Classification Search
CPC .......... G01R 33/3664; G01R 33/3415; G01R 33/3621; G01R 33/5611
USPC ................... 324/318, 322; 333/101
See application file for complete search history.

(56) References Cited

U.S. PATENT DOCUMENTS

| | | | |
|---|---|---|---|
| 7,205,864 B2 * | 4/2007 | Schultz et al. | 333/104 |
| 7,535,230 B2 | 5/2009 | Takagi | |
| 7,557,674 B2 * | 7/2009 | Kamitsuna | 333/104 |
| 2008/0039709 A1 * | 2/2008 | Karmarkar | 600/410 |
| 2008/0218168 A1 * | 9/2008 | Takagi | 324/309 |

FOREIGN PATENT DOCUMENTS

| | | |
|---|---|---|
| CN | 1716682 A | 1/2006 |
| CN | 101261315 | 9/2008 |
| JP | 4-319340 | 11/1992 |
| JP | 2009-278459 | 11/2009 |
| WO | WO 2009/139287 | 11/2009 |

OTHER PUBLICATIONS

International Search Report for PCT/JP2011/077696, mailed Feb. 7, 2012.
English Translation of International Preliminary Report on Patentability issued Jun. 4, 2013 for Application No. PCT/JP2011/077696.
Chinese Office Action dated Mar. 4, 2014 in CN201180004168.4.
Machine Translation of JP2010-511942 (WO 2009/139287).

* cited by examiner

*Primary Examiner* — Melissa Koval
*Assistant Examiner* — Rishi Patel
(74) *Attorney, Agent, or Firm* — Nixon & Vanderhye P.C.

(57) ABSTRACT

A multichannel RF switching device of an embodiment has a connector in which all or some of a plurality of terminals are configured to be connected to a plurality of coil elements, a matrix switch having a plurality of input ports arranged in a line and a plurality of output ports arranged in a line, and a wiring portion connecting the respective terminals configured to be connected to the plural coil elements with a plurality of input ports in use included in the plural input ports one-on-one, the input ports in use amounting to fewer than the total number of the input ports, wherein the wiring portion connects the respective terminals with the input ports in use one-on-one in such a way that a separation between adjacent two of all or some of the input ports in use is larger than a separation between adjacent two of the input ports.

9 Claims, 14 Drawing Sheets

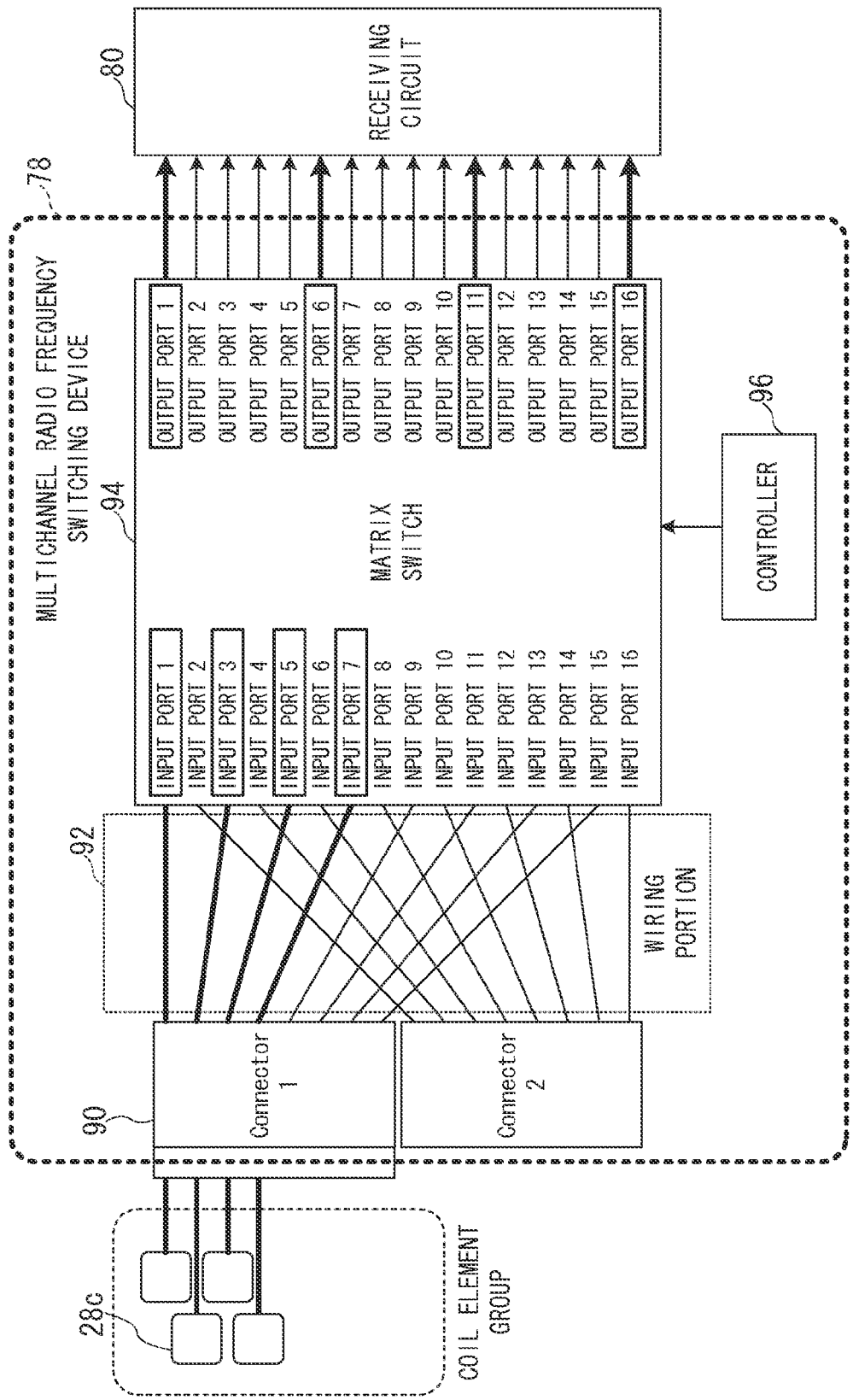
F I G. 14

MULTICHANNEL RF SIGNAL SWITCHING DEVICE AND MAGNETIC RESONANCE IMAGING APPARATUS HAVING MULTICHANNEL RF SIGNAL SWITCHING DEVICE

CROSS-REFERENCE TO RELATED APPLICATIONS

This application is a Continuation Application of No. PCT/JP2011/077696, filed on Nov. 30, 2011, and the PCT application is based upon and claims the benefit of priority from Japanese Patent Applications No. 2010-267585 filed on Nov. 30, 2010, the entire contents of which are incorporated herein by reference.

FIELD

An embodiment of the present invention relates to a multichannel RF signal switching device and a magnetic resonance imaging apparatus having the multichannel RF signal switching device.

BACKGROUND

Various kinds of RF (radio frequency) receiving coils matching their use can be used for magnetic resonance imaging apparatus in recent years. Some kind of such RF receiving coils is formed by lots of coil elements. A particular coil element is chosen from lots of coil elements in accordance with an imaging target part of a patient or an imaging method. Then, a signal received by the chosen coil element is connected to a receiving processor system on a successive stage.

In order to choose a desired number of desired coil elements from lots of coil elements, the magnetic resonance imaging apparatus is provided with a multichannel RF signal switching device called a matrix switch, as disclosed in Japanese Unexamined Patent Publication No. 2009-278459.

The matrix switch has e.g., 128 channels of input ports and 32 channels of output ports. The respective coil elements are each connected to each of the input ports. Thus, e.g., up to 32 received signals are selected from signals received by up to 128 coil elements, so as to output the 32 selected signals to any of the output ports of 32 channels. The received signals outputted from the matrix switch are provided to receiving circuits on a successive stage in parallel.

One of key performance indicators of the matrix switch is inter-channel isolation. Poor inter-channel isolation causes signals received by different coil elements to interfere with one another resulting in a degraded SNR, etc., and degraded image quality.

An imaging method called parallel imaging for which signals of plural coil elements are used is known. Poor isolation among the plural coil elements may possibly cause not only degraded image quality but an error in an expansion process included in the parallel imaging.

The isolation tends tube low between adjacent input ports or adjacent output ports of the matrix switch in particular, and needs to be improved.

SUMMARY

A multichannel RF switching device of an embodiment has a connector having a plurality of terminals, all or some of the plural terminals being configured to be connected to a plurality of coil elements, a matrix switch having a plurality of input ports arranged in a line and a plurality of output ports arranged in a line, the matrix switch being configured to output each of signals inputted to the plural input ports to any chosen one of the plural output ports, and a wiring portion connecting the respective terminals configured to be connected to the plural coil elements with a plurality of input ports in use included in the plural input ports one-on-one, the input ports in use amounting to fewer than the total number of the input ports, wherein the wiring portion connects the respective terminals with the input ports in use one-on-one in such a way that a separation between adjacent two of all or some of the input ports in use is larger than a separation between adjacent two of the input ports.

BRIEF DESCRIPTION OF DRAWINGS

FIG. 14 is a third diagram which depicts an exemplary constitution of a multichannel RF switching device of the second embodiment (first modification).

DESCRIPTION OF EMBODIMENTS

A multichannel RF signal switching device and an MRI apparatus having the multichannel RF signal switching device an embodiment will be explained on the basis of the drawings.

(Magnetic Resonance Imaging Apparatus)

Figure 1:
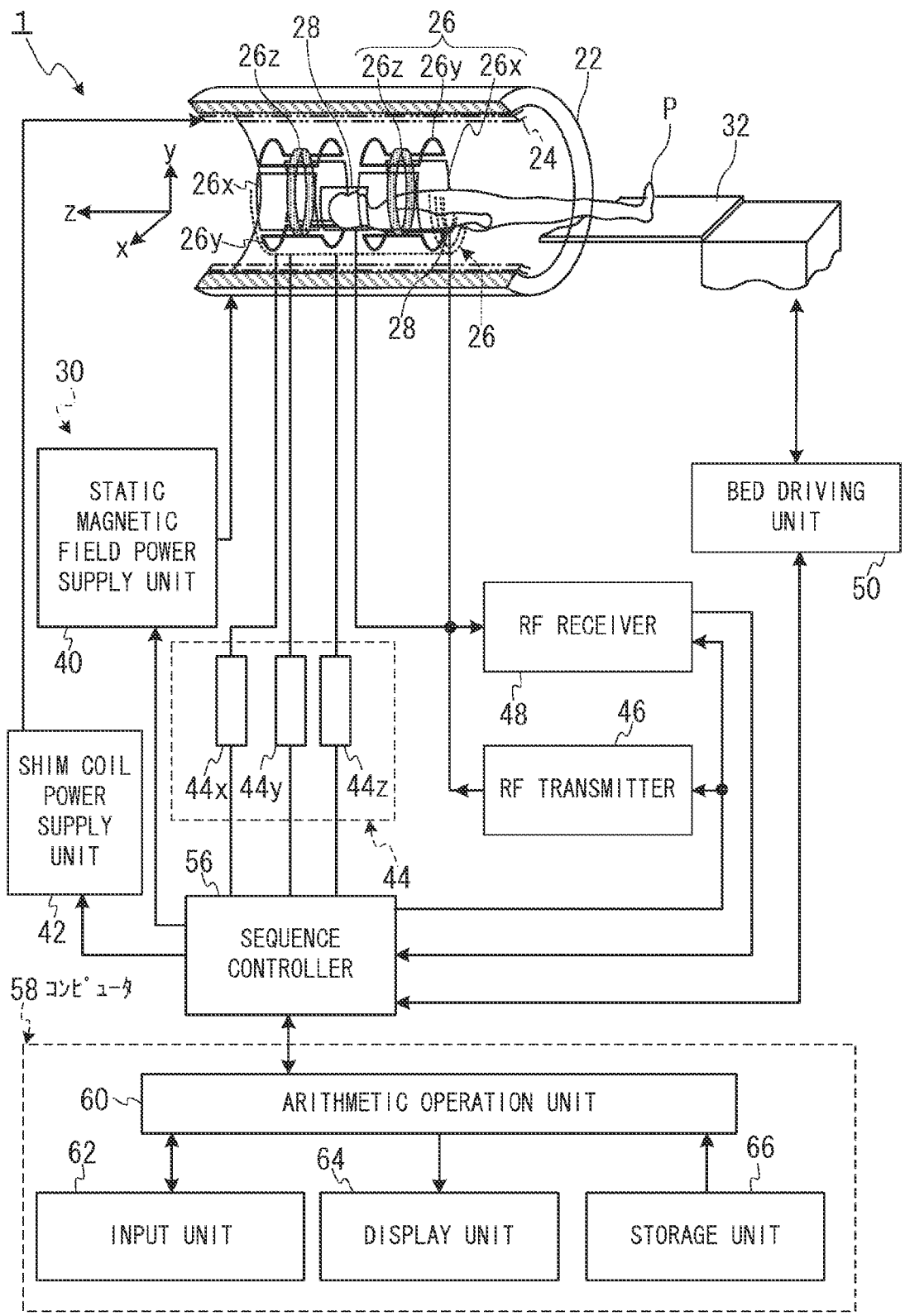
FIG. 1 depicts an exemplary constitution of a magnetic resonance imaging apparatus of an embodiment.

FIG. 1 is a block diagram which entirely depicts a constitution of a magnetic resonance imaging apparatus 1 of the embodiment. As depicted in FIG. 1, the magnetic resonance imaging apparatus 1 has a cylindrical static field magnet 22 which forms a static magnetic field, a cylindrical shim coil 24 provided coaxially with and inside the static field magnet 22, a gradient coil 26, an RF coil 28, a control unit 30 and a bed 32 on which a test object P can be mounted.

An exemplary coordinate system of the apparatus including X-, Y- and Z-axes which are perpendicular to one another is defined here, as follows. To begin with, suppose that the static field magnet 22 and the shim coil 24 are arranged in such a way that their axial directions cross perpendicularly to the vertical direction, and that the axial directions of the static field magnet 22 and the shim coil 24 are in the direction of the Z-axis. Suppose further that the vertical direction is the direction of the Y-axis, and that the bed 32 is arranged in such a way that the direction normal to a top mounting plate of the bed 32 is in the direction of the Y-axis.

The control unit 30 has a static field power supply unit 40, a shim coil power supply unit 42, a gradient power supply unit 44, an RF transmitter 46, an RF receiver 48, a bed driving device 50, a sequence controller 56 and a computer 58.

The gradient power supply unit 44 is formed by an X-axis gradient power supply unit 44$x$, a Y-axis gradient power supply unit 44$y$ and a Z-axis gradient power supply unit 44$z$. Further, the computer 58 is formed by an arithmetic operation unit 60, an input unit 62, a display unit 64 and a storage unit 66.

The static field magnet 22 is connected to the static field power supply unit 40, and forms a static magnetic field in imaging space by means of an electric current supplied by the static field power supply unit 40. The shim coil 24 is connected to the shim coil power supply unit 42, and makes the static magnetic field uniform by means of an electric current supplied by the shim coil power supply unit 42. The static field magnet 22 is formed by a superconductive coil in lots of cases. The static field magnet 22 is connected to the static field power supply unit 40 and is supplied with an electric current in time of excitation, and is usually disconnected once having been excited. Incidentally, the static field magnet 22 may be formed by a permanent magnet without being provided with the static field power supply unit 40.

The gradient coil 26 has an X-axis gradient coil 26$x$, a Y-axis gradient coil 26$y$ and a Z-axis gradient coil 26$z$. The gradient coil 26 is shaped like a cylinder inside the static field magnet 22. The X-, Y- and Z-axis gradient coils 26$x$, 26$y$ and 26$z$ are connected to the X-, Y- and Z-axis gradient power supply units 44$x$, 44$y$ and 44$z$, respectively.

The X-, Y- and Z-axis gradient power supply units 44$x$, 44$y$ and 44$z$ each provide the X-, Y- and Z-axis gradient coils 26$x$, 26$y$ and 26$z$ with an electric current, respectively, so that gradient magnetic fields Gx, Gy and Gz are each formed in the directions of the X-, Y- and Z-axes in the imaging space, respectively.

The gradients Gx, Gy and Gz in three directions in the apparatus coordinate system are combined, so that logical axes which are a slice direction gradient Gss, a phase encode direction gradient Gpe and a read out direction (frequency encode direction) gradient Gro each can be set in any direction. The static magnetic field is overlaid with each of the gradients in the slice, phase encode and read out directions.

The RF transmitter 46 generates an RF pulse of a Larmor frequency for producing a nuclear magnetic resonance on the basis of control information provided by the sequence controller 56, and transmits the RF pulse to the RF coil 28 for transmission. The RF coil 28 may be a whole body coil (WBC) for transmitting and receiving an RF pulse contained in a gantry, or a local coil for receiving an RF pulse provided close to the bed 32 or the test object P. The RF coil 28 for transmission receives an RF pulse from the RF transmitter 46 and transmits the RF pulse to the test object P. The RF coil 28 for receiving receives an MR signal (RF signal) produced as a result of a nuclear spin excited by the RF pulse inside the test object P. The MR signal is detected by the RF receiver 48.

The RF receiver 48 carries out various kinds of data processing such as pre-amplification, intermediate frequency conversion, phase detection, baseband frequency amplification, filtering and so on for the detected MR signal, and then A/D (analog to digital)—converts the MR signal so as to generate raw data which is digitized complex data. The RF receiver 48 outputs the produced raw data of the MR signal to the sequence controller 56.

The arithmetic operation unit. 60 controls the entire magnetic resonance imaging apparatus 1 as a system.

The sequence controller 56 stores therein control information necessary for driving the gradient power supply unit 44, the RF transmitter 46 and the RF receiver 48 as instructed by the arithmetic operation unit 60. The control information mentioned here is, e.g., sequence information such that operation control information related to strength, a period of application or timing of application of a pulse current to be applied to the gradient power supply unit 44 is written.

The sequence controller 56 drives the gradient power supply unit 44, the RF transmitter 46 and the RF receiver 46 in accordance with a stored particular sequence so as to generate the gradient magnetic fields on the X-, Y- and Z-axes Gx, Gy and Gz, respectively, and an RF pulse. Further, the sequence controller 56 receives raw data of an MR signal provided by the RF receiver 48, and provides the arithmetic operation unit 60 with the received raw data of the MR signal.

Figure 2:
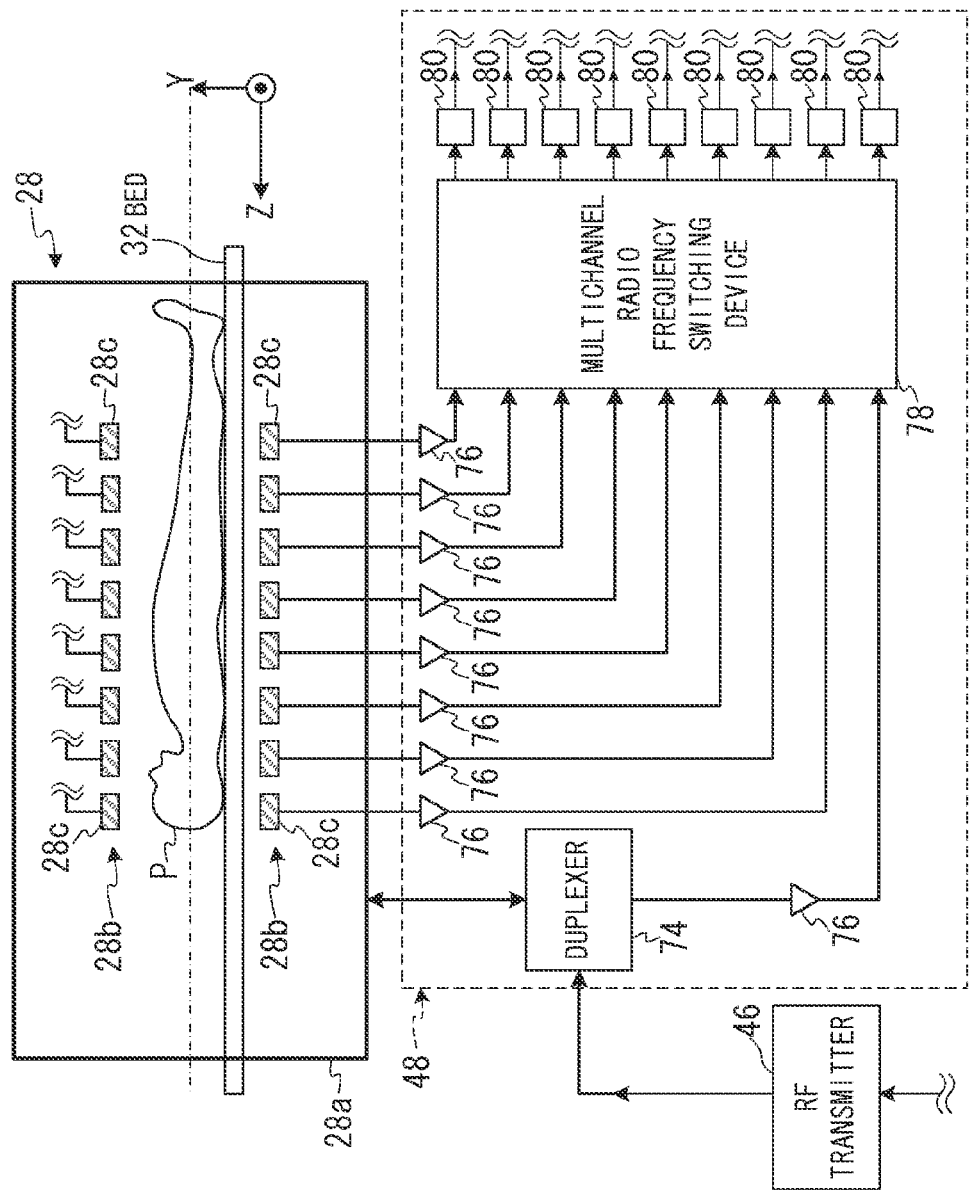
FIG. 2 depicts an exemplary constitution of a system including coil elements and receiving circuits.

FIG. 2 depicts an exemplary detailed constitution of the RF coil 28. As depicted in FIG. 2, the RF coil 28 includes a cylindrical whole body coil 28$a$ (indicated with a bold rectangle in FIG. 2) and phased array coils 28$b$. The whole body coil 28$a$ can be used as a coil for transmitting an RF pulse, and as a coil for receiving an MR signal as well. The phased array coils 28$b$ are formed by lots of coil elements 28$c$ (indicated with rectangles with diagonal hatching in FIG. 2) each being put on the front side or on the back side of the test object P. The coil elements 28$c$ is each used as a coil for receiving an MR signal. Incidentally, exemplary arrangements of the coil elements 28$c$ will b e explained later with reference to FIGS. 3 and 4.

The RF receiver 48 has a duplexer 74, a plurality of amplifiers 76, a multichannel RF switching device 78 and a plurality of receiving circuits 80. The multichannel RF switching device 78 has an input side connected to the respective coil elements 28$c$ and the whole body coil 28$a$ via connectors described later. Further, the receiving circuits 80 are each separately connected to an output side of the multichannel RF switching device 78.

The duplexer 74 provides the whole body coil 28$a$ with an RF pulse transmitted by the RF transmitter 46. Further, the duplexer 74 provides one of the amplifiers 76 with the MR signal received by the whole body coil 28$a$. The MR signal is amplified by the relevant amplifier 76 and is provided to the input side of the multichannel RF switching device 78. The MR signals received by the respective coil elements 28$c$ are each amplified by corresponding one of the amplifiers 76 and provided to the input side of the multichannel RF switching device 78.

The multichannel RF switching device 78 switches over the MR signals detected by the respective coil elements 28$c$ and the whole body coil 28$a$ depending upon the number of the receiving circuits 80, and outputs the MR signals separately to the corresponding receiving circuits 80. The magnetic resonance imaging apparatus 1 forms a sensitivity distribution corresponding to each of imaging target parts by using the whole body coil 28$a$ and a desirable number of the coil elements 28$c$, and receives MR signals coming from various imaging target parts in this way.

Figure 3:
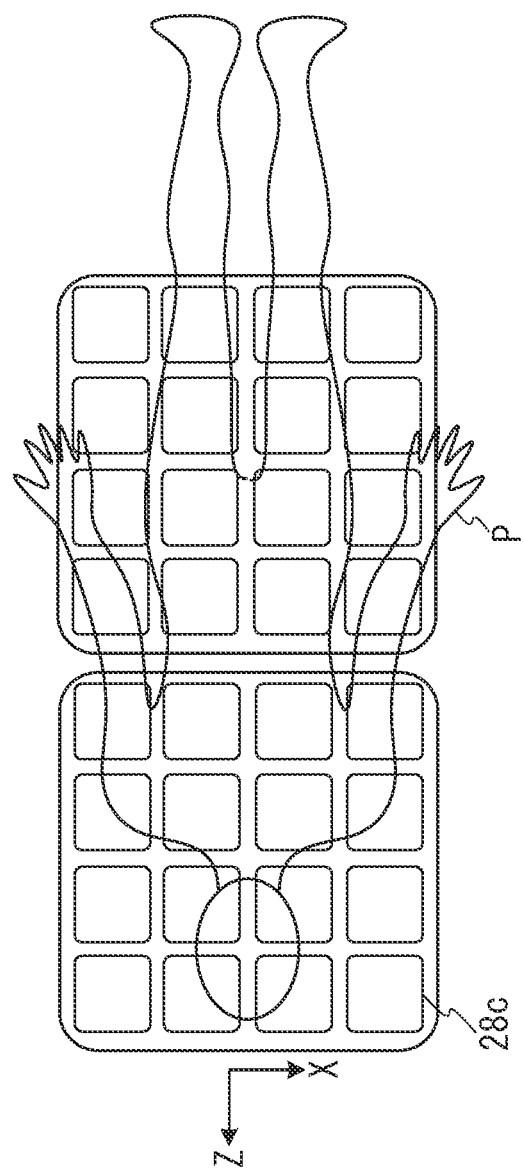
FIG. 3 depicts an exemplary coil element (on the front side of the body)
Figure 4:
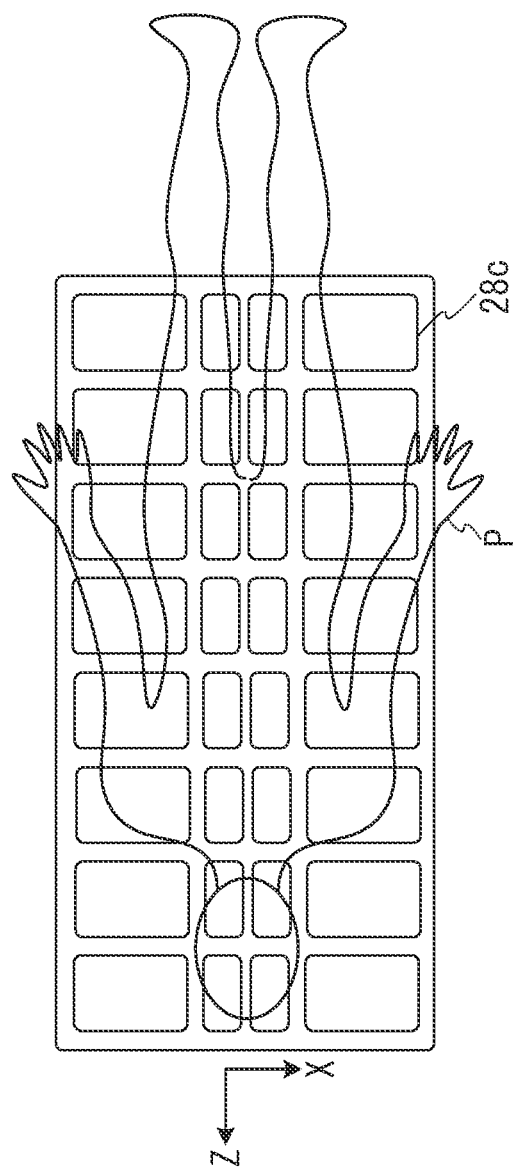
FIG. 4 depicts an exemplary coil element (on the back side of the body)

FIGS. 3 and 4 depict exemplary arrangements of the coil elements 28$c$ put on the front and back sides of the test object P, respectively. The coil elements 28c are each indicated with a square having four round corners in FIG. 3. The coil elements 28c are each indicated with a rectangle having four round corners in FIG. 4.

As depicted in FIG. 3, e.g., a total of 32 coil elements 28c are put on the front side of the test object P in four rows and eight columns in the X-axis and Z-axis directions, respectively, so that a wide area of the imaging target parts can be covered. As depicted in FIG. 4, further, a total of 32 coil elements 28c are put on the back side of the test object P as well in four rows and eight columns in the X-axis and Z-axis directions, respectively, so that a wide area of the imaging target parts can be covered. On the back side, e.g., put coil elements 28c close to the body axis being smaller in size than the other coil elements 28c in view of sensitivity to be enhanced while paying attention to the backbone of the test object P.

The magnetic resonance imaging apparatus 1 uses lots of the coil elements 28c as described above. The number, positions or kinds of the coil elements 28c differ depending upon the imaging target parts of the test object P or imaging methods. Thus, the multichannel RF switching device 78 is provided between lots of the coil elements 28c and the receiving circuits 80, so as to select desirable ones of the coil elements 28c and provide the receiving circuits 80 on the successive stage with the MR signals from the selected coil elements 28c.

Multichannel RF Switching Device

First Embodiment

Figure 5:
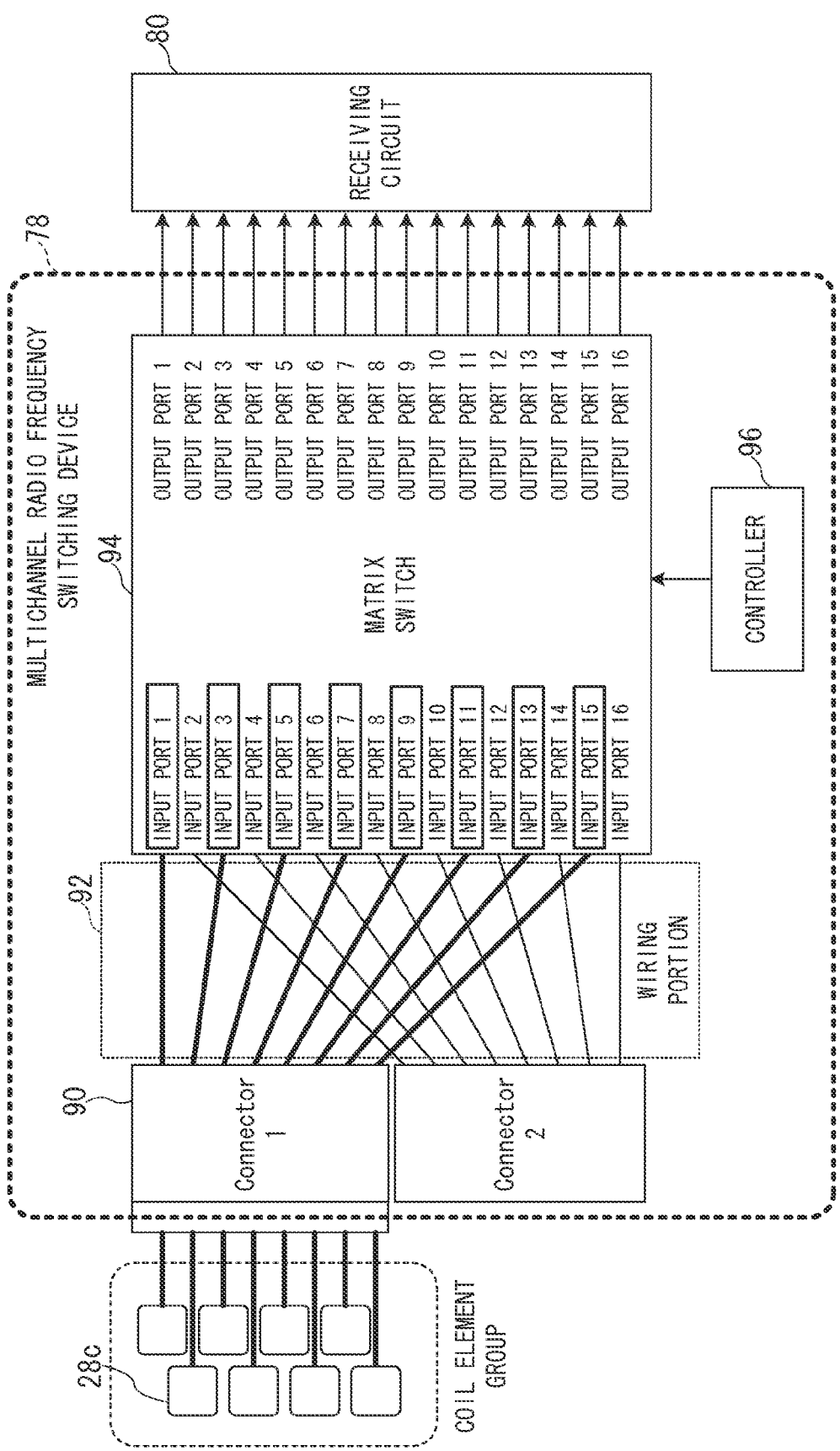
FIG. 5 depicts an exemplary constitution of a multichannel RF switching device of a first embodiment.

FIG. 5 depicts an exemplary constitution of the multichannel RF switching device 78 of the first embodiment. The multichannel RF switching device 78 is formed by including one or a plurality of connectors 90, a wiring portion 92, a matrix switch 94 and a controller 96.

The connector 90 has a plurality of terminals, and all or some of the plural terminals are connected to the plural coil elements 28c. The connector 90 is, e.g., a multicore coaxial connector, and lots of coaxial cables connect the terminals with the coil elements 28c one-on-one. As depicted in FIG. 5, e.g., one of the connectors 90 has eight terminals which are connected separately to eight of the coil elements 28c. The number of terminals in one of the connectors 90 is not limited to the above, nor is the number of the coil elements 28c connected to the terminals. The connector 90 may be formed by including, e.g., 16 terminals.

Further, although FIG. 5 depicts only two of the connectors 90 for simplicity of explanation, the number of the connectors is not limited to the number depicted in FIG. 5. For example, the multichannel RF switching device 78 may be provided with eight of the connectors 90 each having 16 terminals so that maximum 128 of the coil elements 28c can be connected to the multichannel RF switching device 78.

The matrix switch 94 has a plurality of input ports arranged to form a line and a plurality of output ports arranged to form a line as well. The matrix switch 94 is configured to output each of signals provided to the plural input ports selectively to any one of the output ports.

Figure 6:
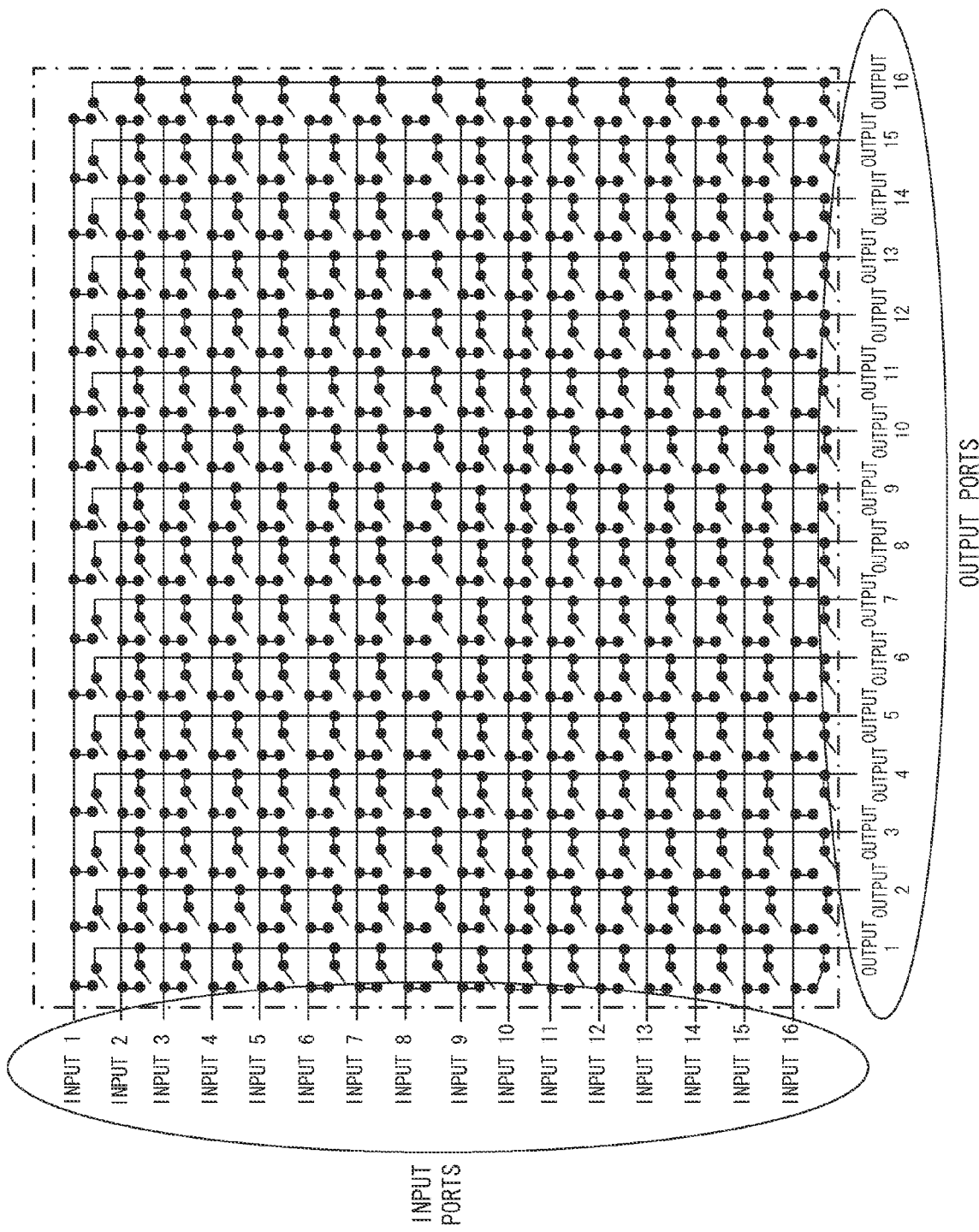
FIG. 6 depicts an exemplary internal constitution of a matrix switch.

FIG. 6 schematically depicts an internal constitution of the matrix switch 94. FIG. 6 depicts an example of the matrix switch 94 having 16 input ports and 16 output ports. The matrix switch 94 has an internal pattern such that parallel lines extended horizontally from the respective input ports and parallel lines extended vertically from the respective output ports form a latticed structure according to a general rule. Each of crossings in the lattice is provided with a switch to form a matrix.

The numbers of the input ports and the output ports may differ from each other in some cases, and may be, e.g., 32 and 16, respectively. If that is the case, it is enabled to choose any 16 of 32 input signals so as to output each of the chosen 16 input signals to any one of the 16 output ports without overlapping them.

While the matrix switch 94 can be formed by discrete circuits, it can be formed by integrated circuits to be downsized. The matrix switch 94 having 32 input ports and 16 output ports, e.g., can be formed by n integrated circuit of several millimeters square in size. Further, it is enabled to connect plural matrix switches with one another in a hierarchic manner so as to increase the number of input ports. For example, if four and two of the above matrix switch elements each having 32 input ports and 16 output ports are arranged in parallel on the first and the second stages, respectively, a matrix switch 94 having 128 input ports and 32 output ports can be formed as a whole.

Isolation between input ports of the matrix switch 94 physically put adjacent to each other is lower than isolation between input ports physically put away from each other as a general rule. Further, the isolation between two input ports is higher as a separation between the two input ports is larger.

In FIG. 5, for example, isolation between input ports 1 and 2 is lower than isolation between input ports 1 and 3. A reason why is that two lines each, connected to each of two adjacent input ports are horizontally extended long in parallel and that the one of the two lines are physically put closer to the other than to any other line.

Thus, the multichannel RF switching device 78 is provided with the wiring portion 92 between the connectors 90 and the matrix switch 94 as depicted in FIG. 5, so that it is enabled to avoid using adjacent input ports as much as possible and to enhance isolation among the input ports.

Signals coming from lots of the coil elements 28c can be connected to the multichannel RF switching device 78 via the connectors 90 as described above. Meanwhile, the number of the coil elements 28c to be practically used changes depending upon the imaging target part or imaging method. Thus, the matrix switch 94 is configured to have enough width, i.e., the number of input ports is set large enough to absorb the change of the number of the coil elements 28c to be connected. Namely, the number of the coil elements 28c to be practically connected to the matrix switch 94 is smaller than the total number of the input ports of the matrix switch 94 in lots of cases. In other words, the number of "the input ports of the matrix switch 94 being practically connected to the coil elements 28c" (called "Input ports in use" hereafter) is smaller than the total number of the input ports.

Thus, the wiring portion 92 of the embodiment connects the respective terminals of the connector 90 connected to the plural coil elements with the "input ports in use" one-on-one, the "input ports in use" being included in but not as many as all the input ports. Further, the wiring portion 92 connects the respective terminals with the "input ports in use" one-on-one in such a way that a separation between adjacent two of the input ports in use is greater than a separation between adjacent two of the input ports for all or some of the "input ports in use".

In FIG. 5, the input ports of the matrix switch 94 being connected to the coil elements 28c (i.e., "input ports in use") are each identified with an enclosing box, and it is indicated that the input ports 1, 3, etc., are the "input ports in use". Meanwhile, the input ports not being connected with the coil elements 28c (i.e. input ports not in use) are the input ports 2, 4, etc., which are indicated without enclosing boxes.

The wiring portion 92 of the first embodiment connects the respective terminals with the "input ports in use" one-on-one in such a way that adjacent two of the "input ports in use" are provided between them with at least one input port not in use (e.g., one input port not in use in FIG. 5). Owing to the above connection, the physical separation between the "input ports in use" is made larger and the isolation between the "input ports in use" can be enhanced. The wiring portion 92 is implemented by a printed wiring board on which connection lines are printed as wiring patterns, etc.

Figure 7:
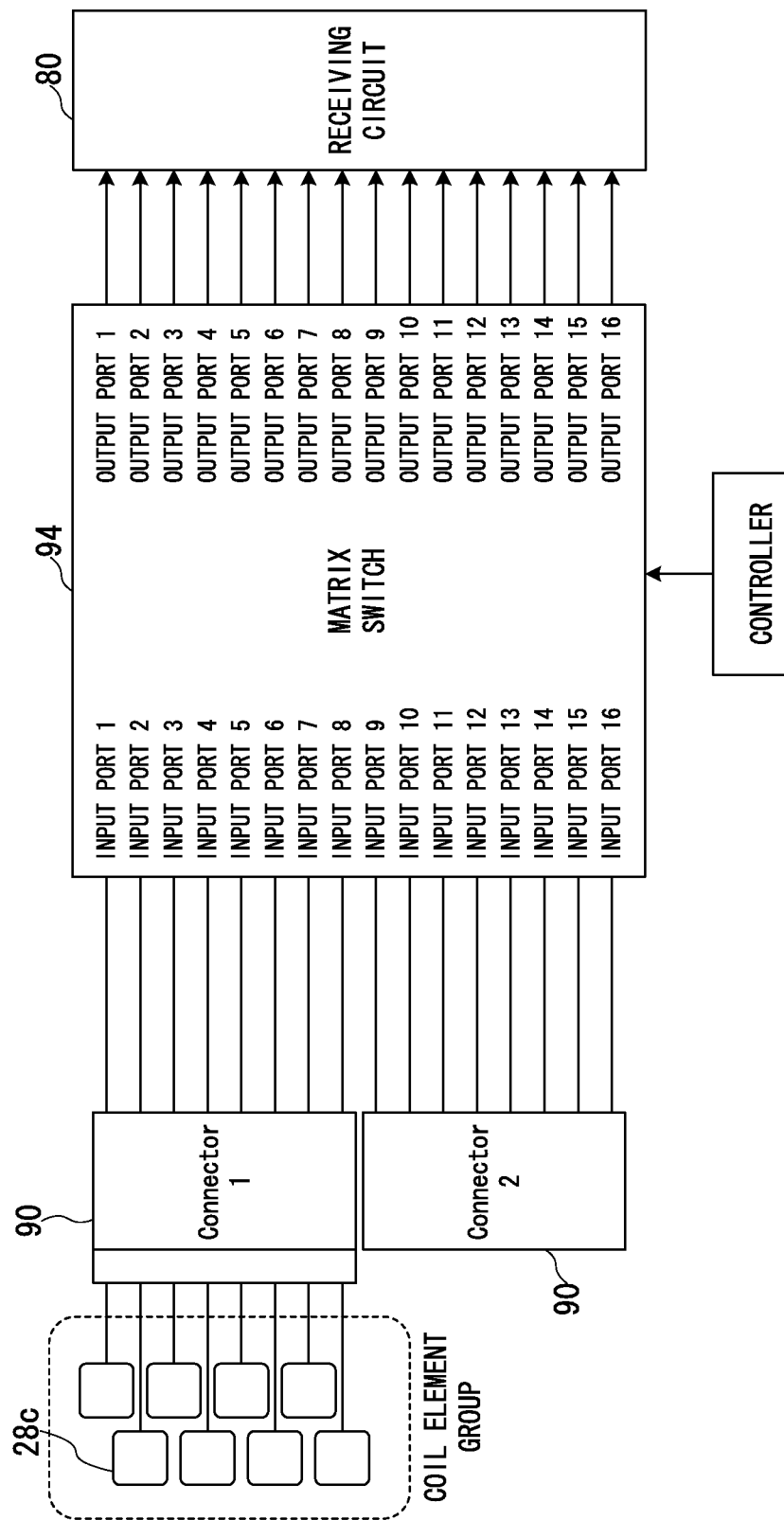
FIG. 7 depicts an exemplary ordinary multichannel RF switching device (to be compared with the embodiment)

FIG. 7 depicts a conventional method for connecting the coil elements 28c with the matrix switch 94 to be exemplarily compared with the multichannel RF switching device 78. According to the conventional method, the terminals of the connector 90 are connected with the input ports of the matrix switch 94 in arranged order of the input ports while no space is left between them. Thus, even if the number of connected coil elements 28c is not so large, adjacent input ports are used resulting in that the isolation between the input ports is degraded.

Meanwhile, as the multichannel RF switching device 78 of the first embodiment depicted in FIG. 5 uses the input ports on an alternate basis, the isolation between the input ports can be enhanced.

First Modification

Figure 8:
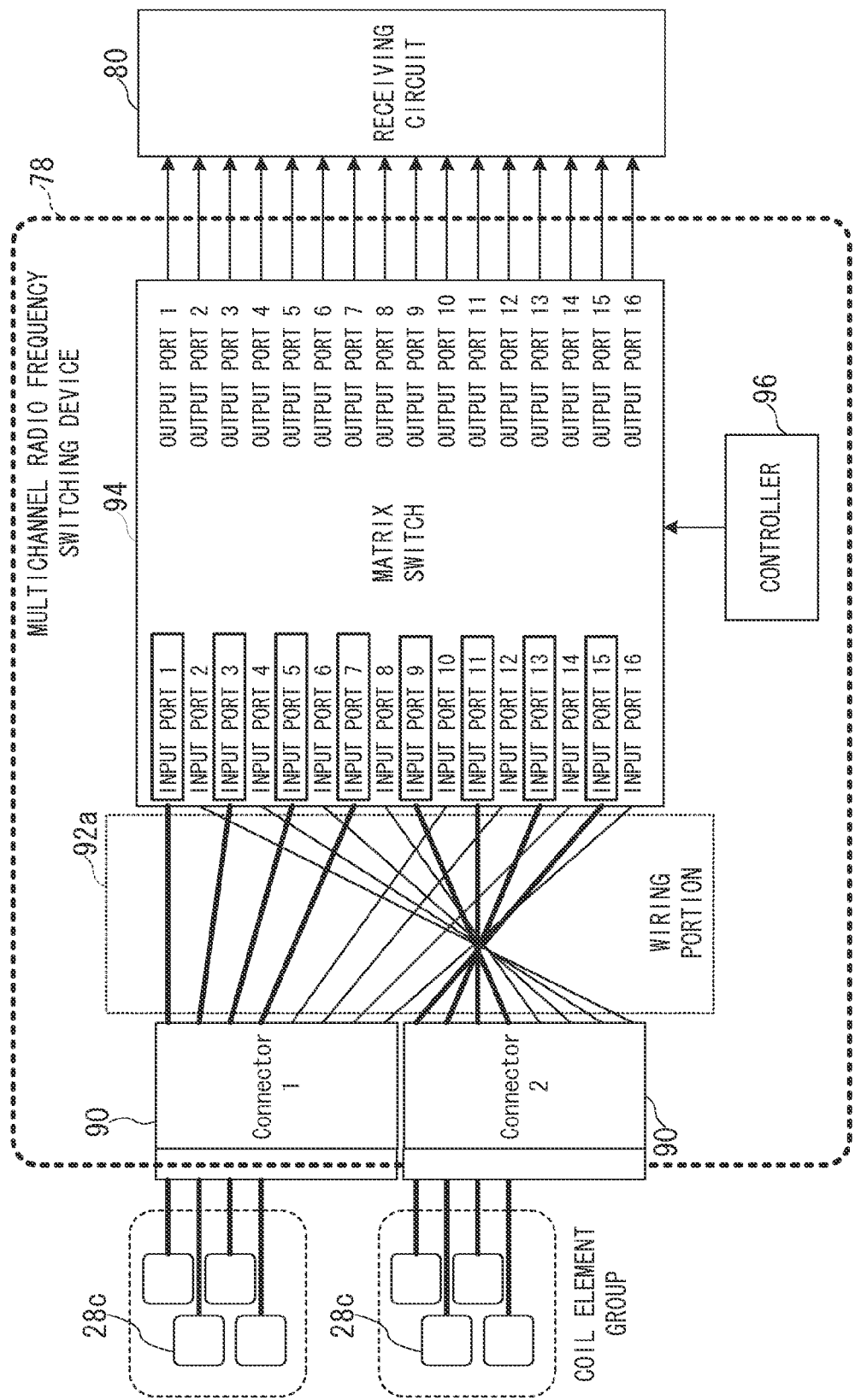
FIG. 8 depicts an exemplary constitution of a multichannel RF switching device of the first embodiment (first modification)

FIG. 8 depicts an exemplary constitution of a multichannel RF switching device 78 of a first modification of the first embodiment. In lots of cases, not all of but only part of the terminals of the connector 90 are connected with the coil elements 28c. In FIG. 8, e.g., two of the connectors 90 each having eight terminals in all are each connected with four of the coil elements 28c. If the wiring portion 92 which is entirely same as that depicted in FIG. 5 is used in such a case, input ports adjacent to each other, e.g., the input ports 1 and 2 are each connected with the coil elements 28c.

Thus, according to the embodiment depicted in FIG. 8, a wiring portion 92a whose internal connection is different from that depicted in FIG. 5 is used, so that use of input ports adjacent to each other is avoided.

Second Modification

Figure 9:
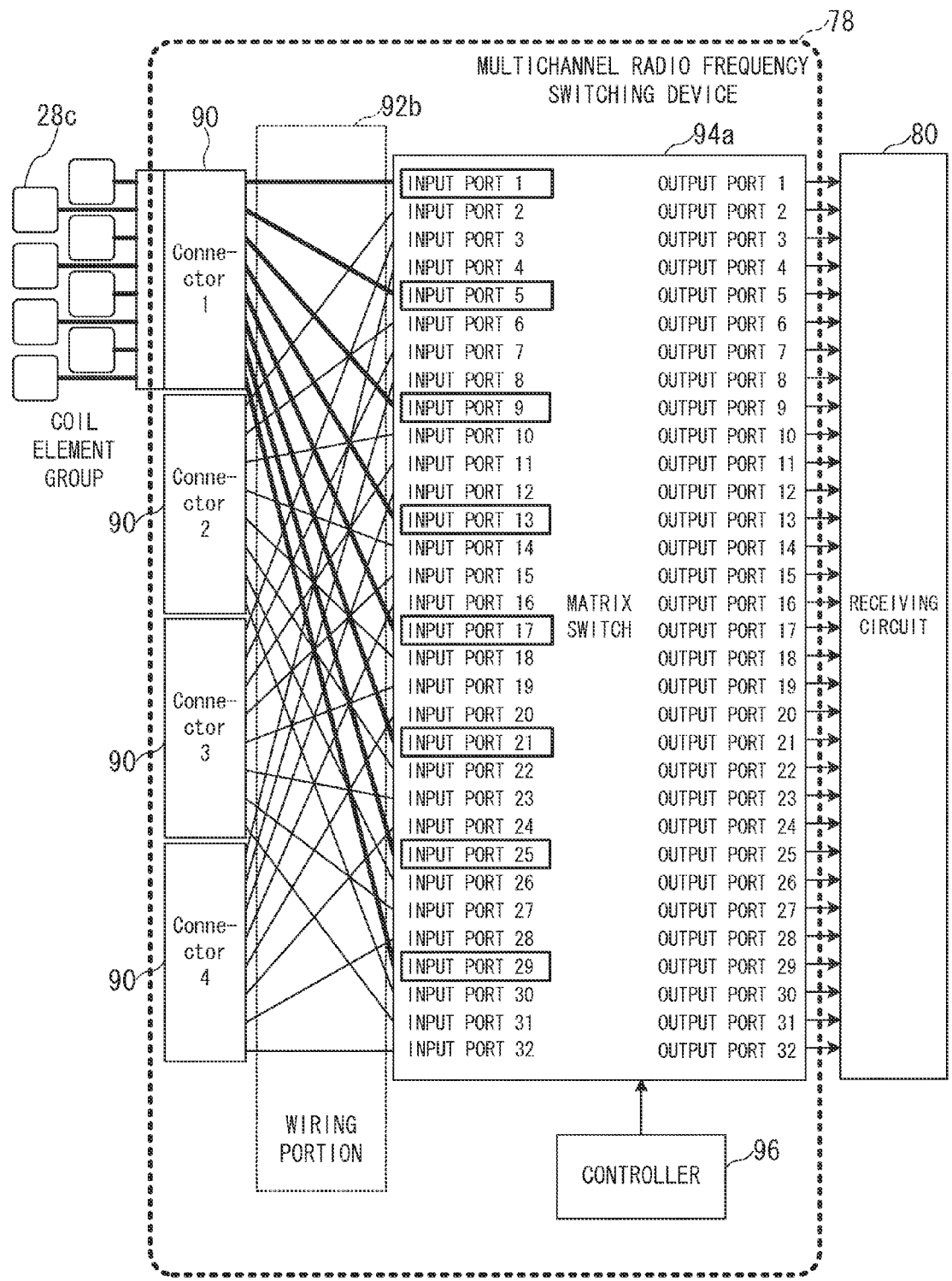
FIG. 9 is a first diagram which depicts an exemplary constitution of a multichannel RF switching device of the first embodiment (second modification)

FIG. 9 depicts an exemplary constitution of a multichannel RF switching device 78 of a second modification of the first embodiment. If the number of the input ports of the matrix switch 94 is larger enough than the number of the coil elements 28c connected to the input ports, the separation between the "input ports in use" can further be broadened and the isolation between the "input ports in use" can further be enhanced.

As depicted in FIG. 9, e.g., while the number of the connected coil elements 28c is eight, the number of the input ports of the matrix switch 94 is four times as many as the coil elements 28c, i.e., 32. In this case, connection such that three input ports not in use are put between adjacent two "input ports in use" is enabled, so that still higher isolation can be secured. A wiring portion 92b depicted in FIG. 9 is to implement such connection.

Figure 10:
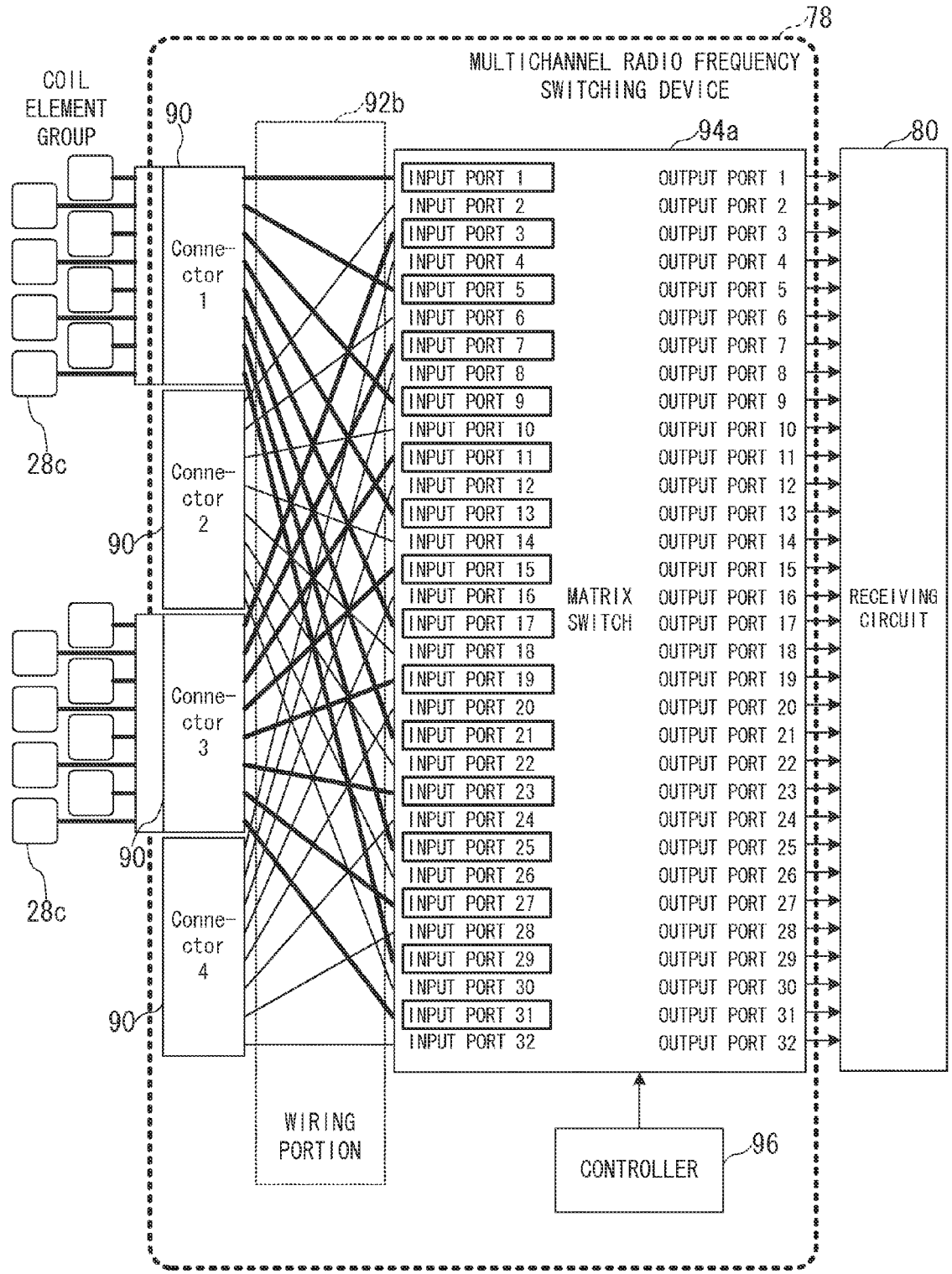
FIG. 10 is a second diagram which depicts an exemplary constitution of a multichannel RF switching device of the first embodiment (second modification)

FIG. 10 depicts the multichannel RF switching device 78 which is a same as that depicted in FIG. 9 being connected with further eight of the coil elements 28c via a connector 3. In this case, although the "input ports in use" are put on an alternate basis and the isolation is slightly lower than that in FIG. 9, sufficient isolation can be secured as at least one of the input ports not in use is put between adjacent two of the "input ports in use".

Incidentally, if the number of the connected coil elements 28c is made larger than that in FIG. 10, the multichannel RF switching device 78 can achieve as a whole higher isolation than the isolation depending upon the ordinary connection method (see FIG. 7) although some of the input ports in use are put adjacent to each other.

Second Embodiment

Isolation between the output ports physically put adjacent to each other is lower than isolation between the output ports physically put away from each other, similarly as the isolation between the input ports. The isolation between two of the output ports is higher as a separation between the two of the output ports is larger.

Thus, a controller 96 of a multichannel RF switching device 78 of a second embodiment chooses "output ports in use" in such a way that a separation between "output ports in use" adjacent to each other is larger than a separation between two of the output ports adjacent to each other, so as to enhance isolation between the "output ports in use". The "output ports in use" are part of the plural output ports and each correspond to each of the "input ports in use" one-on-one.

Figure 11:
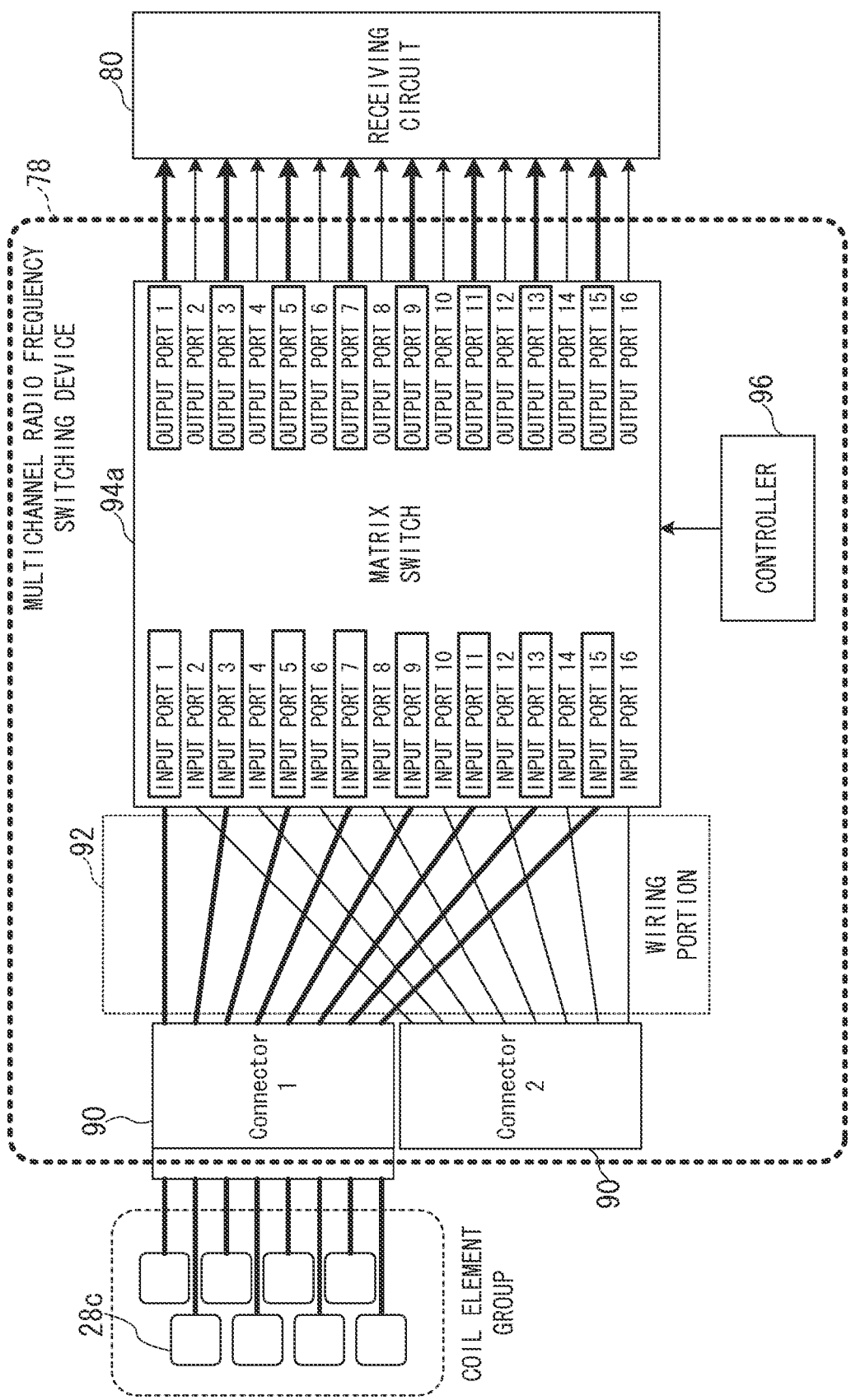
FIG. 11 depicts an exemplary constitution of a multichannel RF switching device of a second embodiment.

The output ports individually indicated with an enclosing box in FIG. 11 are the "output ports in use" in FIG. 11, e.g. signals coming from eight of the coil elements 28c are outputted to eight of the "output ports in use" included in 16 of the output ports and arranged on an alternate basis. As one of the output ports is put between every two of the "output ports in use", separations between the "output ports in use" can be physically broadened and high isolation can be achieved compared to a case where adjacent two of the output ports are used.

First Modification of Second Embodiment

Figure 12:
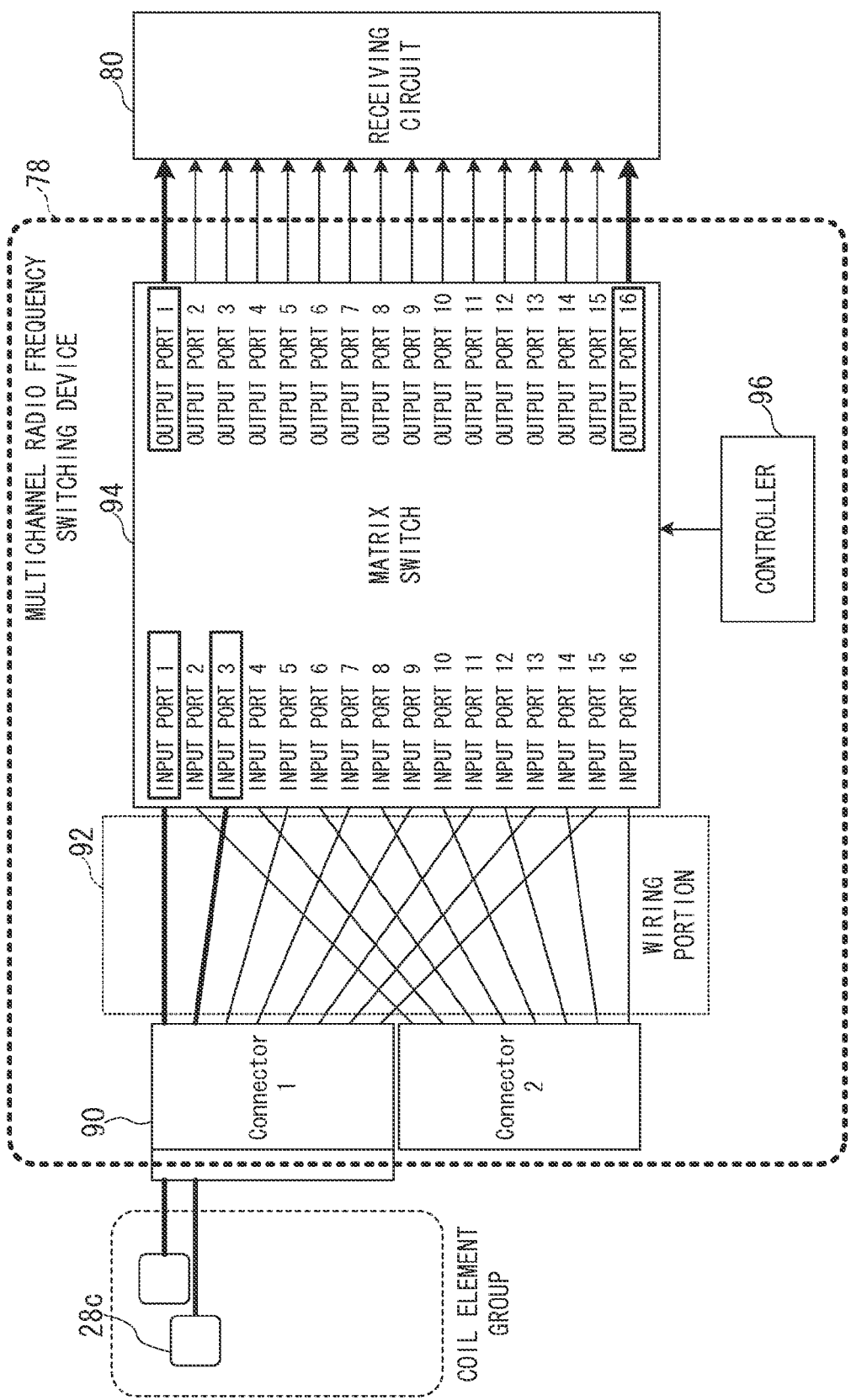
FIG. 12 is a first diagram which depicts an exemplary constitution of a multichannel RF switching device of the second embodiment (first modification)
Figure 13:
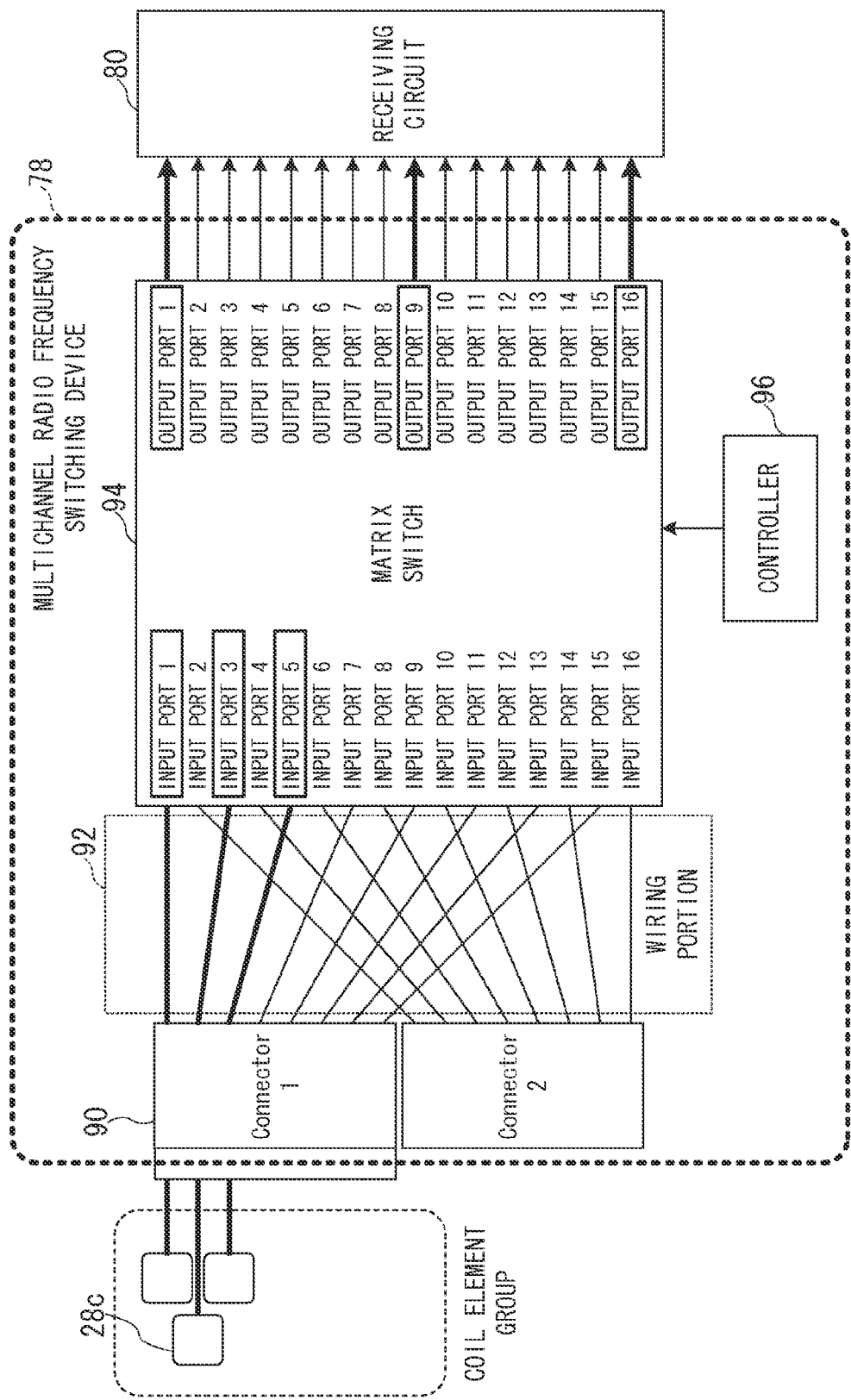
FIG. 13 is a second diagram which depicts an exemplary constitution of a multichannel RF switching device of the second embodiment (first modification)

FIGS. 12-14 illustrate a first modification of the second embodiment. According to the first modification, separation between both ends of the output ports arranged in a line be a maximum separate distance. In that case, the controller 96 of the first modification chooses the output ports on the both ends as the "output ports in use" if the number of the output ports in use is two, and chooses the "output ports in use" in such a way that the maximum separate distance is substantially equally divided if the number of the "output ports in use" is three and over.

FIG. 12 depicts a case where the number of the output ports in use is two and the output ports 1 and 16 on the both ends are chosen as the "output ports in use".

FIG. 13 depicts a case where the number of the "output ports in use" is three, and the output ports 1, 9 and 16 are chosen in such a way that the distance between the output ports 1 and 16 (maximum separate distance) is substantially equally divided (divided in half).

FIG. 14 depicts a case where the number of the "output ports in use" is four, and the output ports 1, 6, 11 and 16 are chosen in such a way that the maximum separate distance is divided into three substantially equal segments.

According to the first modification of the second embodiment, the "output ports in use" are chosen in such a way that the distances between the "output ports in use" are rendered even and maximum depending upon the number of the "output ports in use" (which equals the number the connected coil elements 28c) in this way, unbiased and high isolation can be achieved between the output ports in use.

Second Modification of Second Embodiment

Isolation between adjacent two of the output ports is lowest in the matrix switch 94 as usual. Depending upon individual characteristic variation, etc., however, isolation between two of the output ports put slightly apart from each other may be further lower in some cases.

According to the second modification of the second embodiment, then, isolation data obtained in time of quality test of the matrix switch 94, etc, is preserved in a suitable memory in the controller 96, and the isolation data is referred when choosing the "output ports in use".

For example, the "output port use" are preferably chosen in descending order of isolation values depending upon the number of the "output ports in use". While in reverse, the "output ports in use" may be chosen from the output ports excluding the ones of low isolation.

The multichannel RF switching device 78 and the magnetic resonance imaging apparatus 1 including the multichannel RF switching device 78 of each of the embodiments can enhance the isolation of the matrix switch as described above.

The embodiments of the invention having been explained are presented only as examples, and it is not intended to limit the scope of the invention to the embodiments. The embodiments can be implemented in other various forms. Some portions of the embodiments can be variously omitted, replaced or changed within the scope of the invention. The embodiments and their modifications are included within a range and the scope of the invention, and included within a range of claimed inventions and their equivalents as well.

What is claimed is:

1. A multichannel RF switching device comprising:
   at least one connector including a plurality of terminals, all or some of the plurality of terminals configured to be connected to a plurality of coil elements;
   a matrix switch including a plurality of input ports arranged in a line and a plurality of output ports arranged in a line, the matrix switch being configured to output signals inputted to each of the plural input ports to any one of the plural output ports; and
   a wiring portion individually connecting said terminals of the at least one connector with individual ones of input ports in use, the input ports in use amounting to fewer than the total number of the input ports, wherein the wiring portion connects the terminals and the input ports in use in such a way that a separation between adjacent input ports in use is larger than a separation between two adjacent ones of the input ports.

2. The multichannel RF switching device according to claim 1, wherein the wiring portion individually connects the terminals of the at least one connector with individual ones of the input ports in use in such a way that at least one of input ports not in use is arranged between two adjacent input ports in use, the input ports not in use being the input ports except the input ports in use.

3. The multichannel RF switching device according to claim 1, wherein the at least one connector comprises a plurality of connectors.

4. The multichannel RF switching device according to claim 3, wherein the plurality of connectors comprise a first connector and a second connector, and the wiring portion connects the input ports which lie between the input ports in use, the input ports in use being connected to at least some the terminals of the first connector, with the terminals of the second connector.

5. The multichannel RF switching device according to claim 1, wherein the wiring portion is a multilayered printed circuit board.

6. The multichannel RF switching device according to claim 1, wherein the at least one connector is a multicore coaxial connector.

7. The multichannel RF switching device according to claim 1, further comprising a controller which chooses a plurality of output ports in use included in the plurality of output ports, each of the output ports in use corresponding to an individual one of the input ports in use, wherein the controller chooses the output ports in use in such a way that a separation between two adjacent output ports in use is larger than a separation between two adjacent ones of the output ports.

8. The multichannel RF switching device according to claim 7, wherein when the needed output ports in use is two, the controller chooses the two output ports to be at opposite ends of output ports arranged in a line as the output ports in use, and wherein when the needed output ports in use is three or more, the controller chooses the output ports such that a distance of the opposite ends of output ports arranged in a line is substantially equally divided by the chosen outputs ports.

9. A magnetic resonance imaging apparatus comprising the multi-channel RF switching device according to claim 1.

* * * * *